US012772856B2

(12) United States Patent
Chen

(10) Patent No.: US 12,772,856 B2
(45) Date of Patent: Oct. 20, 2026

(54) SHIELDING CIRCUITS AND SEMICONDUCTOR DEVICES COMPRISING INDUCTOR AND ELECTRONIC COMPONENT

(71) Applicant: Realtek Semiconductor Corp., HsinChu (TW)

(72) Inventor: Yung-Chung Chen, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 535 days.

(21) Appl. No.: 18/143,056

(22) Filed: May 3, 2023

(65) Prior Publication Data

US 2023/0387037 A1 Nov. 30, 2023

(30) Foreign Application Priority Data

May 31, 2022 (TW) .................................. 111120279

(51) Int. Cl.
*H10W 42/20* (2026.01)
*H03B 5/12* (2006.01)

(52) U.S. Cl.
CPC ............... *H10W 42/20* (2026.01); *H03B 5/12* (2013.01)

(58) Field of Classification Search
CPC ............... H01L 23/552; H01L 23/5225; H01L 23/5223; H03B 5/12; H10W 20/423; H10W 42/20; H10W 20/496
USPC .......................................................... 257/659
See application file for complete search history.

(56) References Cited

U.S. PATENT DOCUMENTS

2016/0365189 A1* 12/2016 Jin ...................... H01L 23/5227
2017/0163274 A1* 6/2017 Cheng Chang ........... G06F 1/08
2022/0320004 A1* 10/2022 Chang ................. H01L 23/5225

FOREIGN PATENT DOCUMENTS

TW 202135264 A 9/2021

* cited by examiner

*Primary Examiner* — Didarul A Mazumder
(74) *Attorney, Agent, or Firm* — Winston Hsu

(57) ABSTRACT

A shielding circuit applied to a semiconductor device includes a first shielding structure and a second shielding structure. The first shielding structure forms a first closed loop and is disposed adjacent to an inductor comprised in the semiconductor device. The second shielding structure forms a second closed loop and is disposed adjacent to an electronic component coupled to the inductor.

11 Claims, 5 Drawing Sheets

SHIELDING CIRCUITS AND SEMICONDUCTOR DEVICES COMPRISING INDUCTOR AND ELECTRONIC COMPONENT

BACKGROUND OF THE INVENTION

1. Field of the Invention

The invention relates to a shielding circuit to reduce radiation, and more particularly to a shielding circuit to reduce radiation in inductor and capacitor circuits.

2. Description of the Prior Art

In an integrated circuit (IC) chip, an inductor is a passive electronic component that stores energy in a magnetic field created by an electric current passing through it. Each inductor may include a number of coils where the loops create a magnetic field inside the coils. The magnetic field inside the coils may vary over time depending on the current passing through the inductor.

Inductors are usually combined with capacitors to form a resonant circuit, for example, an inductor-capacitor resonant cavity (LC tank) circuit, which is used as an electronic resonator to store oscillation energy when the circuit resonates. For example, when an LC tank circuit is utilized in a radio frequency circuit, the overall circuit is able to operate at a higher frequency and have better phase noise performance, but such an application is easily affected by the magnetic field induced by the inductors and thus undesirable radiation is created, causing the signal to be radiated through the inductor. In addition, other parts of the LC tank circuit also generate radiation, causing interference.

To solve the radiation problem caused by the electronic circuit, a novel shielding circuit, especially the shielding circuit to be applied to the electronic circuit comprising the inductors, is required to reduce or eliminate the radiation generated by the inductor or other electronic components.

SUMMARY OF THE INVENTION

An objective of the invention is to focus on a novel shielding circuit to reduce or eliminate the radiation generated by the inductor or other electronic components to solve the aforementioned problem.

According to an embodiment of the invention, a shielding circuit applied to a semiconductor device comprises a first shielding structure and a second shielding structure. The first shielding structure forms a first closed loop and is disposed adjacent to an inductor comprised in the semiconductor device. The second shielding structure forms a second closed loop and is disposed adjacent to an electronic component coupled to the inductor.

According to an embodiment of the invention, a semiconductor device comprises a shielding circuit and an electronic component. The shielding circuit comprises at least two shielding structures and each shielding structure forms a closed loop. The electronic component is coupled to an inductor. One of said at least two shielding structures is disposed adjacent to the electronic component.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
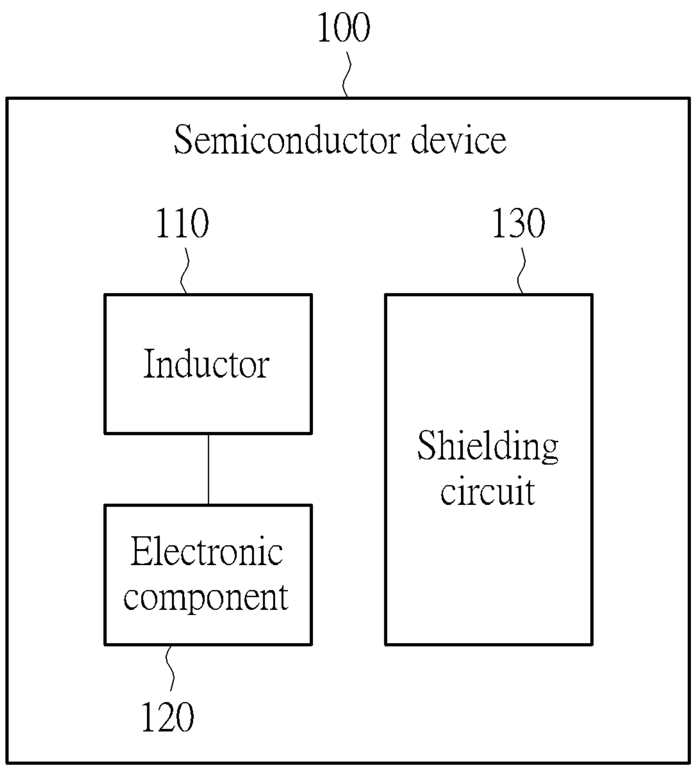
FIG. 1 shows an exemplary block diagram of a semiconductor device according to an embodiment of the invention.

FIG. 1 shows an exemplary block diagram of a semiconductor device according to an embodiment of the invention. The semiconductor device 100 may comprise at least an inductor 110, at least one electronic component 120 coupled to the inductor 110 and a shielding circuit 130. It is to be noted that, in order to clarify the concept of the invention, FIG. 1 presents a simplified block diagram of a semiconductor device in which only the components relevant to the invention are shown. Those skilled in the art can understand that a semiconductor device may further comprise many elements not shown in FIG. 1 to implement related functions according to its circuit design. In addition, it is also to be noted that FIG. 1 shows one or more embodiments of the invention by way of illustration, not limitation, and the components therein are not necessarily drawn to scale.

The shielding circuit 130 is disposed adjacent to the inductor 110 and the electronic component 120 to reduce or eliminate the radiation generated by the inductor 110 and the electronic component 120. According to an embodiment of the invention, the shielding circuit 130 may comprise at least two shielding structures, and each shielding structure forms an independent closed loop.

To be more specific, in an embodiment of the invention, the shielding circuit 130 may comprise a first shielding structure and a second shielding structure, wherein the first shielding structure may form a first closed loop and disposed adjacent to the inductor 110. The second shielding structure may form a second closed loop and disposed adjacent to the electronic component 120. For example, the first shielding structure may be formed of metal material and may have a substantially ring or square shape. If an electronic signal (e.g., a current) travels from an originating node of the first shielding structure, the electrical signal will eventually loop back to the originating node. Similarly, the second shielding structure may also be formed of metal material, and may have a substantially ring or square shape. If an electronic signal (e.g., a current) travels from an originating node of the second shielding structure, the electronic signal will eventually loop back to the originating node of the second shielding structure. It is to be noted that although the above embodiments are described with a ring shape or a square shape, the invention is not limited thereto. In some other embodiments of the invention, as long as a closed circuit can be formed respectively, the first shielding structure and the second shielding structure may also be arranged in any irregular shapes.

In an embodiment of the invention, the semiconductor device 100 may be a device with a multi-layer structure, the inductor 110, the electronic component 120 and the shielding circuit 130 may be implemented on the same layer or different layers, and the invention is not limited to any specific implementation. In addition, the inductor 110, the electronic component 120, and the shielding circuit 130 may be respectively implemented on the same layer, or any of them may be implemented across different layers. For example, a first portion of the inductor 110 may be implemented on the first metal layer, and a second portion of the inductor 110 may be implemented on the second metal layer, wherein the first metal layer and the second metal layer are different layers. Similarly, a first portion of the shielding circuit 130 may be implemented on a third metal layer, and a second portion of the shielding circuit 130 may be implemented on a fourth metal layer, wherein the third metal layer and the fourth metal layer are different layers, but the first metal layer and one of the third metal layer and the fourth metal layer may be the same layer or different layers, or, the second metal layer and one of the third metal layer and the fourth metal layer may be the same layer or different layers. The invention is not limited to any specific implementation.

Figure 2:
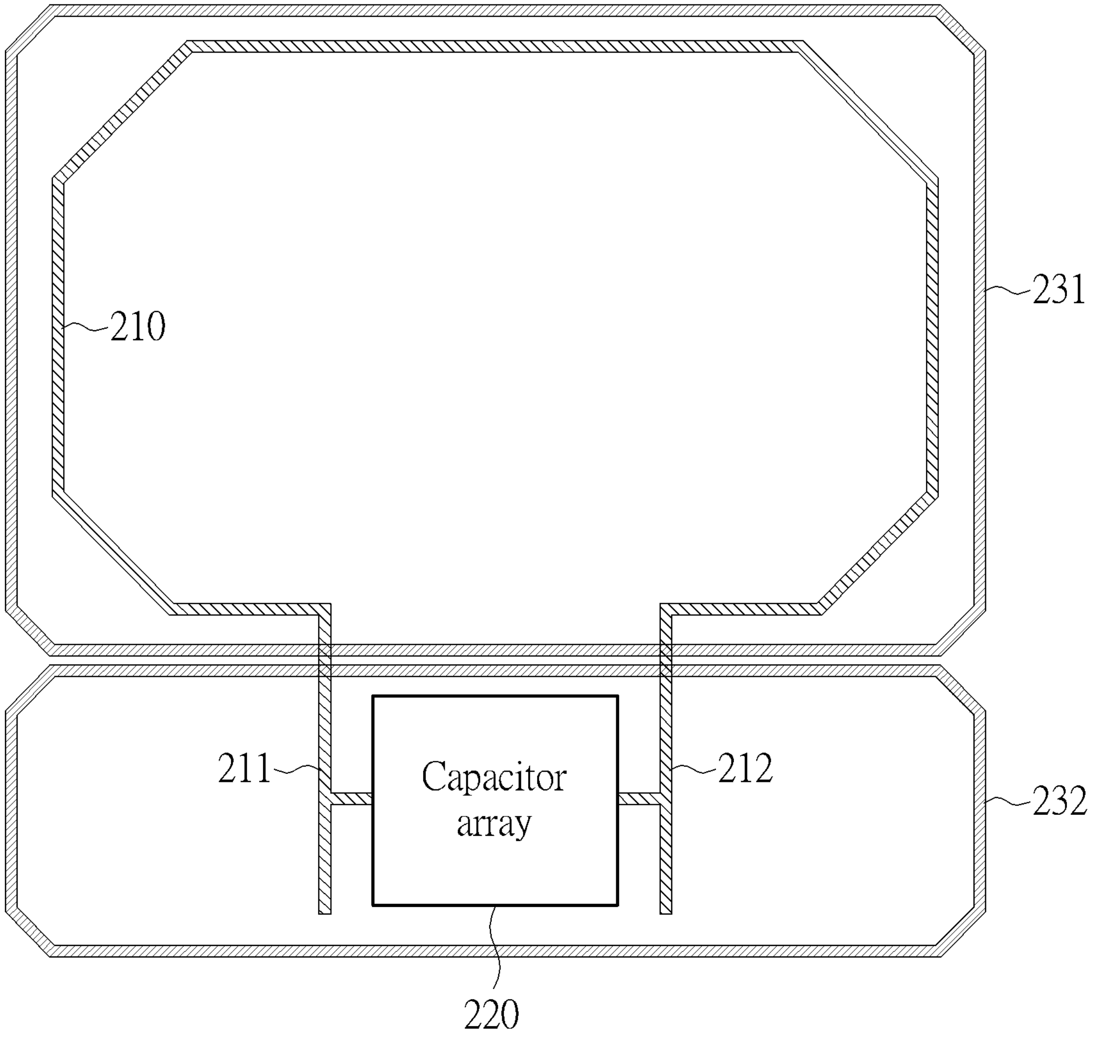
FIG. 2 shows an exemplary layout of a shielding circuit according to an embodiment of the invention.

FIG. 2 shows an exemplary layout of a shielding circuit according to an embodiment of the invention. The inductor 210 may comprise at least one coil, and may be coupled to at least one electronic component, such as a capacitor array 220 shown in FIG. 2, through the extra fork 211 and extra fork 212, which may also be regarded as bifurcated wires or branching traces, connected to the coil. The coil may be the main portion of the inductor 210, and the extra forks 211 and 212 connected to the coil may also be selectively regarded as a part of the inductor. However, for simplicity, in this specification, the inductor referred herein is directed to the main portion of the inductor (that is, the main coil portion), regardless of the type of the inductor, and may not comprise the extra forks (or, bifurcated wires or branching traces) connected to the main portion, winding wires jumping to other layers, and long-distance wires used to connect the inductor to other electronic components. The shielding circuit may comprise a first shielding structure 231 and a second shielding structure 232.

FIG. 2 is a top view, for example, a top view viewed from an upper surface of the semiconductor device toward the bottom layer. It is to be noted that although the inductor 210, the capacitor array 220, the first shielding structure 231 and the second shielding structure 232 are drawn on the same plane in FIG. 2, it is not an actual limitation. As mentioned above, the inductor 210, the capacitor array 220, the first shielding structure 231 and the second shielding structure 232 may be implemented on the same layer or different layers, and the inductor 210, the capacitor array 220, the first shielding structure 231 and the second shielding structure 232 may be respectively implemented on the same layer, or one or more of the inductor 210, the capacitor array 220, the first shielding structure 231 and the second shielding structure 232 may have a cross-layer structure.

According to an embodiment of the invention, when the first shielding structure 231 and the inductor 210 are implemented on the same layer, the first shielding structure 231 may surround the inductor 210, but is electrically insulated from the inductor 210. That is, the first shielding structure 231 and the inductor 210 will not be in contact. It is to be noted that since the first shielding structure 231 and the inductor 210 will not be in contact, one of the first shielding structure 231 and the inductor 210 will actually be cross-layered processed (e.g., it may be connected to other layers through vias and connected back to the original layer) at the intersection as shown in FIG. 2. In other words, although the first shielding structure 231 and the inductor 210 seem to have two intersection points in the top view of FIG. 2, these two intersection points do not actually exist. Therefore, for the case when the first shielding structure 231 and the inductor 210 are respectively implemented on the same layer, it may actually be the case that the first shielding structure 231 and the inductor 210 are substantially implemented on the same layer, and one of them may have a portion that is implemented on a different layer, so as to prevent the first shielding structure 231 from being electrically connected to the inductor 210.

When the first shielding structure 231 and the inductor 210 are implemented on different layers, the first shielding structure 231 may also have an arrangement similar to surrounding the inductor 210. For example, along a vertical direction of the stacking of semiconductor layers (e.g., along the direction from the upper surface of the semiconductor device to the bottom layer), a projection of the first shielding structure 231 on a predetermined plane (e.g., a surface or a plane formed by the bottom layer or any layer of the semiconductor device) may surround a projection of the inductor 210 on the predetermined plane. The component layout shown in FIG. 2 also illustrates the projection result of each component on the predetermined plane along the vertical direction.

In addition, according to an embodiment of the invention, the first shielding structure 231 may form a first closed loop, and a projected area of the first closed loop on a predetermined plane may be greater than a projected area of the inductor 210 on the predetermined plane, wherein the projected area of the first closed loop may be the range surrounded by the projection of the first shielding structure 231 on the predetermined plane. Similarly, the projected area of the inductor 210 may be the range surrounded by the projection of the inductor 210 (or the main portion of the inductor) on the predetermined plane.

It is to be noted that, in other embodiments of the invention, a projected area of the first closed loop on a predetermined plane may also be smaller than or equal to a projected area of the inductor 210 on the predetermined plane. For example, when the first shielding structure 231 and the inductor 210 are implemented on different layers of the semiconductor device, the projection of the first shielding structure 231 on a predetermined plane may completely or partially overlap the projection of the inductor 210 on the predetermined plane, or may be surrounded by the projection of the inductor 210 on the predetermined plane.

In addition, according to an embodiment of the invention, when the second shielding structure 232 and the capacitor array 220 are implemented on the same layer, the second shielding structure 232 may surround the capacitor array 220, but is electrically insulated from the capacitor array 220. That is, the second shielding structure 232 is not in contact with the capacitor array 220. It is to be noted that since the second shielding structure 232 and the capacitor array 220 are not in contact, one of the second shielding structure 232 and the extra forks 211 and 212 connected to the capacitor array 220 will actually be cross-layered processed at the intersection as shown in FIG. 2 (e.g., jumping to another layer through vias). In other words, although the second shielding structure 232 and the extra forks 211 and 212 seem to have two intersections in the top view of FIG. 2, these two intersection points do not actually exist. Therefore, for the case when the second shielding structure 232 and the capacitor array 220 are respectively implemented on the same layer, it may actually be the case that the second shielding structure 232 and the capacitor array 220 are substantially implemented on the same layer, and one of them may have a portion implemented on a different layer, so as to prevent the second shielding structure 232 from being electrically connected to the extra forks 211 and 212.

When the second shielding structure 232 and the capacitor array 220 are implemented on different layers, the second shielding structure 232 may also have an arrangement similar to surrounding the capacitor array 220. For example, the projection of the second shielding structure 232 on a predetermined plane (e.g., a surface or a plane formed by the bottom layer or any layer of the semiconductor device) along the vertical direction (e.g., along the direction from the upper surface of the semiconductor device to the bottom layer) may surround the projection of the capacitor array 220 on the predetermined plane.

In addition, according to an embodiment of the invention, the second shielding structure 232 may form a second closed loop, and the projected area of the second closed loop on a predetermined plane may be greater than the projected area of the capacitor array 220 on the predetermined plane, wherein the projected area of the second closed loop may be the range surrounded by the projection of the second shielding structure 232 on the predetermined plane. Similarly, the projected area of the capacitor array 220 may be the range surrounded by the projection of the capacitor array 220 (or, an integral comprising the capacitor array 220 and the extra forks 211 and 212 connected to the capacitor array 220).

It is to be noted that, in other embodiments of the invention, a projected area of the second closed loop on a predetermined plane may also be smaller than or equal to a projected area of the capacitor array 220 (or, an integral comprising the capacitor array 220 and the extra forks 211 and 212 connected to the capacitor array 220) on the predetermined plane. For example, when the second shielding structure 232 and the capacitor array 220 are implemented on different layers of the semiconductor device, the projection of the second shielding structure 232 on a predetermined plane may completely or partially overlap the projection of the capacitor array 220 (or, an integral comprising the capacitor array 220 and the extra forks 211 and 212 connected to the capacitor array 220) on the predetermined plane, or may be surrounded by the projection of the capacitor array 220 (or, an integral comprising the capacitor array 220 and the extra forks 211 and 212 connected to the capacitor array 220) on the predetermined plane.

According to an embodiment of the invention, as shown in FIG. 2, the first shielding structure 231 and the second shielding structure 232 are electrically separated. Therefore, the first closed loop and the second closed loop are two independent loops. However, the invention is not limited to electrically separating the two shielding structures.

Figure 3:
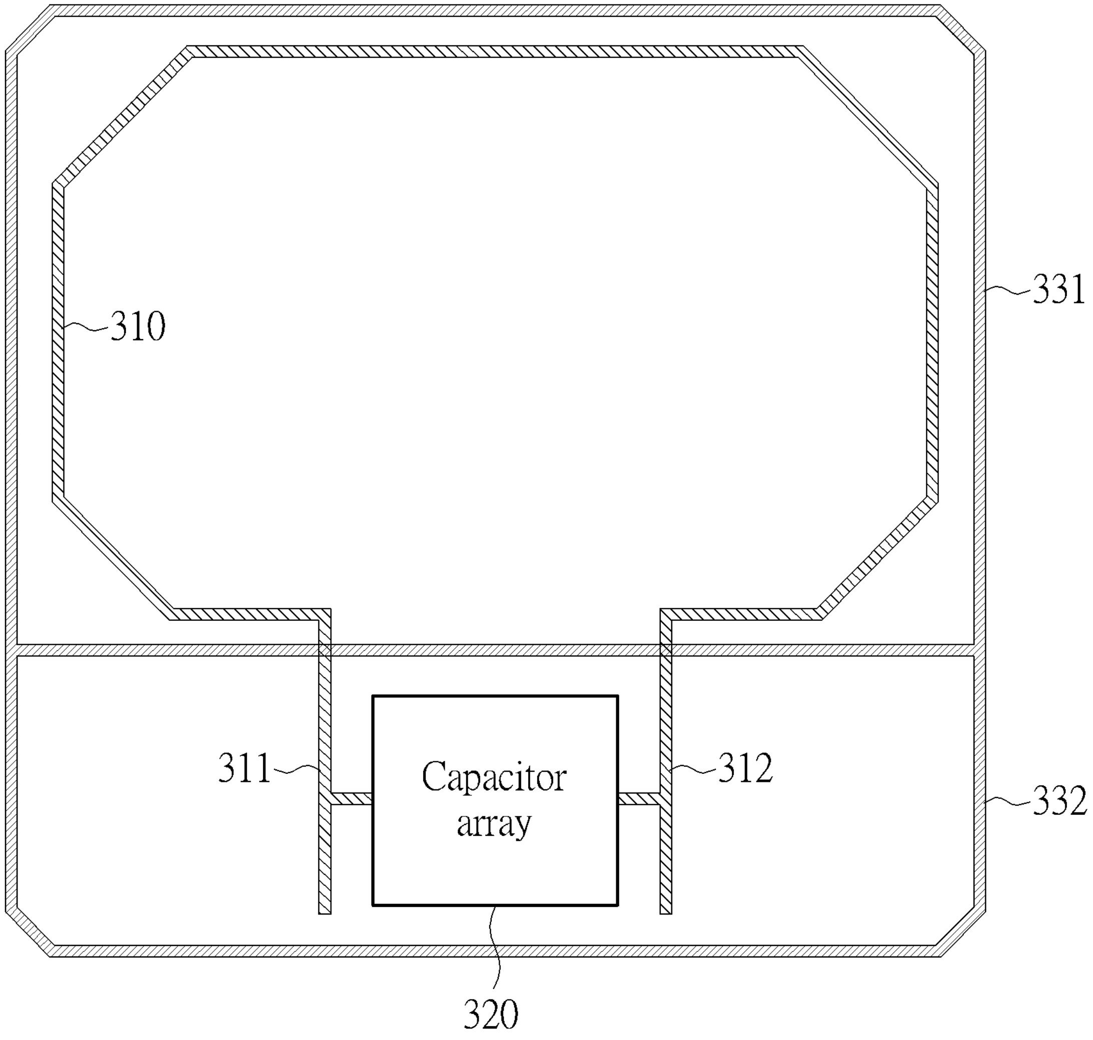
FIG. 3 shows an exemplary layout of a shielding circuit according to another embodiment of the invention.

FIG. 3 shows an exemplary layout of a shielding circuit according to another embodiment of the invention. The inductor 310 may comprise at least one coil, and is coupled to at least one electronic component, such as a capacitor array 320 shown in FIG. 3, through the extra fork 311 and extra fork 312, which may also be regarded as bifurcated wires or branching traces, connected to the coil. The shielding circuit may comprise a first shielding structure 331 and a second shielding structure 332.

FIG. 3 is a top view, for example, a top view viewed from an upper surface of a semiconductor device toward the bottom layer. It is to be noted that although the inductor 310, the capacitor array 320, the first shielding structure 331 and the second shielding structure 332 are drawn on the same plane in FIG. 3, it is not an actual limitation. As mentioned above, the inductor 310, the capacitor array 320, the first shielding structure 331 and the second shielding structure 332 may be implemented on the same layer or different layers, and the inductor 310, the capacitor array 320, the first shielding structure 331 and the second shielding structure 332 may be respectively implemented on the same layer, or one or more of the inductor 310, the capacitor array 320, the first shielding structure 331 and the second shielding structure 332 may have a cross-layer structure.

According to an embodiment of the invention, as shown in FIG. 3, the first shielding structure 331 and the second shielding structure 332 may be electrically connected, or they may be combined. For example, the first shielding structure 331 and the second shielding structure 332 may have a common side, or may share a portion thereof.

In addition, according to an embodiment of the invention, when the first shielding structure 331 and the inductor 310 are implemented on the same layer, the first shielding structure 331 may surround the inductor 310, but is electrically insulated from the inductor 310. That is, the first shielding structure 331 and the inductor 310 will not be in contact. It is to be noted that since the first shielding structure 331 and the inductor 310 will not be in contact, one of the first shielding structure 331 (or, the common side of the first shielding structure 331 and the second shielding structure 332) and the inductor 310 will actually be cross-layered processed (e.g., through vias) at the intersections shown in FIG. 3. In other words, although the first shielding structure 331 and the inductor 310 seem to have two intersection points in the top view of FIG. 3, these two intersection points do not actually exist. Therefore, for the case when the first shielding structure 331 and the inductor 310 are respectively implemented on the same layer, it may actually be the case that the first shielding structure 331 and the inductor 310 are substantially implemented on the same layer, and one of them may have a portion that is implemented on a different layer, so as to prevent the first shielding structure 331 from being electrically connected to the inductor 310.

When the first shielding structure 331 and the inductor 310 are implemented on different layers, the first shielding structure 331 may also have an arrangement similar to surrounding the inductor 310. For example, along a vertical direction (e.g., along the direction from the upper surface of the semiconductor device to the bottom layer), a projection of the first shielding structure 331 on a predetermined plane (e.g., a surface or a plane formed by the bottom layer or any layer of the semiconductor device) may surround a projection of the inductor 310 on the predetermined plane. The component layout shown in FIG. 3 also illustrates the projection result of each component on the predetermined plane along the vertical direction.

In addition, according to an embodiment of the invention, the first shielding structure 331 may form a first closed loop, and a projected area of the first closed loop on a predetermined plane may be greater than a projected area of the inductor 310 on the predetermined plane, wherein the projected area of the first closed loop may be the range surrounded by the projection of the first shielding structure 331 on the predetermined plane. Similarly, the projected area of the inductor 310 may be the range surrounded by the projection of the inductor 310 (or the main portion of the inductor).

It is to be noted that, in other embodiments of the invention, a projected area of the first closed loop on a predetermined plane may also be smaller than or equal to a projected area of the inductor 310 on the predetermined plane. For example, when the first shielding structure 331 and the inductor 310 are implemented on different layers of the semiconductor device, the projection of the first shielding structure 331 on a predetermined plane may completely or partially overlap the projection of the inductor 310 on the predetermined plane, or may be surrounded by the projection of the inductor 310 on the predetermined plane.

In addition, according to an embodiment of the invention, when the second shielding structure 332 and the capacitor array 320 are implemented on the same layer, the second shielding structure 332 may surround the capacitor array 320, but is electrically insulated from the capacitor array 320. That is, the second shielding structure 332 is not in contact with the capacitor array 320. It is to be noted that since the second shielding structure 332 and the capacitor array 320 are not in contact, one of the second shielding structure 332 (or, the common side of the first shielding structure 331 and the second shielding structure 332) and the extra forks 311 and 312 connected to the capacitor array 320 will actually be cross-layered processed at the intersections as shown in FIG. 3 (e.g., jumping to another layer through vias). In other words, although the second shielding structure 332 and the extra forks 311 and 312 seem to have two intersection points in the top view of FIG. 3, these two intersection points do not actually exist. Therefore, the case when the second shielding structure 332 and the capacitor array 320 are respectively implemented on the same layer, it may actually be the case that the second shielding structure 332 and the capacitor array 320 are substantially implemented on the same layer, and one of them may have a portion that is implemented on a different layer, so as to prevent the second shielding structure 332 from being electrically connected to the extra forks 311 and 312.

When the second shielding structure 332 and the capacitor array 320 are implemented on different layers, the second shielding structure 332 may also have an arrangement similar to surrounding the capacitor array 320. For example, the projection of the second shielding structure 332 on a predetermined plane along the vertical direction may surround the projection of the capacitor array 320 on the predetermined plane.

In addition, according to an embodiment of the invention, the second shielding structure 332 may form a second closed loop, and the projected area of the second closed loop on a predetermined plane may be greater than the projected area of the capacitor array 320 on the predetermined plane, wherein the projected area of the second closed loop may be the range surrounded by the projection of the second shielding structure 332 on the predetermined plane. Similarly, the projected area of the capacitor array 320 may be the range surrounded by the projection of the capacitor array 320 (or, an integral comprising the capacitor array 320 and the extra forks 311 and 312 connected to the capacitor array 320).

It is to be noted that, in other embodiments of the invention, a projected area of the second closed loop on a predetermined plane may also be smaller than or equal to a projected area of the capacitor array 320 (or, an integral comprising the capacitor array 320 and the extra forks 311 and 312 connected to the capacitor array 320) on the predetermined plane. For example, when the second shielding structure 332 and the capacitor array 320 are implemented on different layers of the semiconductor device, the projection of the second shielding structure 332 on a predetermined plane may completely or partially overlap the projection of the capacitor array 320 (or, an integral comprising the capacitor array 320 and the extra forks 311 and 312 connected to the capacitor array 320) on the predetermined plane, or may be surrounded by the projection of the capacitor array 320 (or, an integral comprising the capacitor array 220 and the extra forks 311 and 312 connected to the capacitor array 320) on the predetermined plane.

In addition, it is to be noted that although in the above embodiments, the electronic component coupled to the inductor is a capacitor array, the invention is not limited thereto. In other embodiments of the invention, the electronic components coupled to the two terminals (e.g., positive and negative terminals, or positive and negative taps (tap)) of the inductor may be a plurality of capacitor arrays, one or more transistors, or any type and any number of active or passive components. In an embodiment of the invention, the shielding circuit may comprise at least two shielding structures, and each shielding structure forms a closed loop. One of the at least two shielding structures is disposed adjacent to the inductor, for example, surrounding the inductor or have an arrangement similar to surrounding the inductor, and another of the at least two shielding structures is disposed adjacent to an electronic component coupled to the inductor, for example, surrounding the electronic component or have an arrangement similar to surrounding the electronic component.

Figure 4:
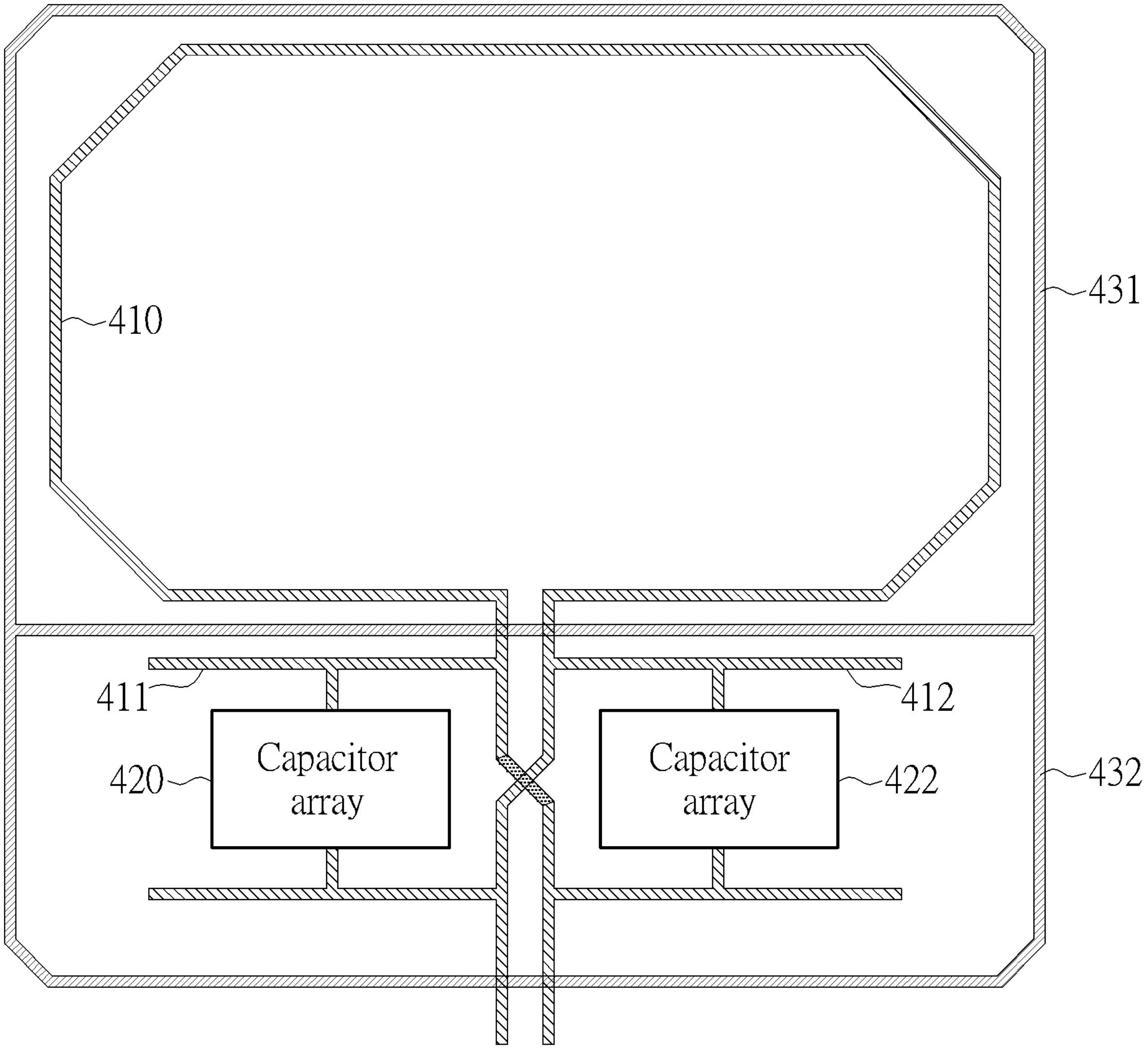
FIG. 4 shows an exemplary layout of a shielding circuit according to yet another embodiment of the invention.

FIG. 4 shows an exemplary layout of a shielding circuit according to yet another embodiment of the invention. The inductor 410 may comprise at least one coil, and is coupled to a capacitor array 420 through the extra fork 411 and extra fork 412, which may also be regarded as bifurcated wires or branching traces, connected to the coil. The shielding circuit may comprise a first shielding structure 431 and a second shielding structure 432. The first shielding circuit 431 is disposed adjacent to the inductor 410, for example, surrounding the inductor 410 or have an arrangement similar to surrounding the inductor 410, and the second shielding circuit 432 is disposed adjacent to capacitor arrays 420 and 422, for example, surrounding the capacitor arrays 420 and 422 or have an arrangement similar to surrounding the capacitor arrays 420 and 422. FIG. 4 shows a circuit structure similar to the one in FIG. 3, and the differences are in the patterns of the extra forks and the number of electronic components coupled to the inductor (i.e., in FIG. 4, there are multiple capacitor arrays coupled to the inductor). Since similar symbols are utilized in FIG. 3 and FIG. 4 to refer to the same electronic components, detailed descriptions regarding the components shown in FIG. 4 may refer to the descriptions of the corresponding components in FIG. 3 and will not be repeated here for brevity.

Figure 5:
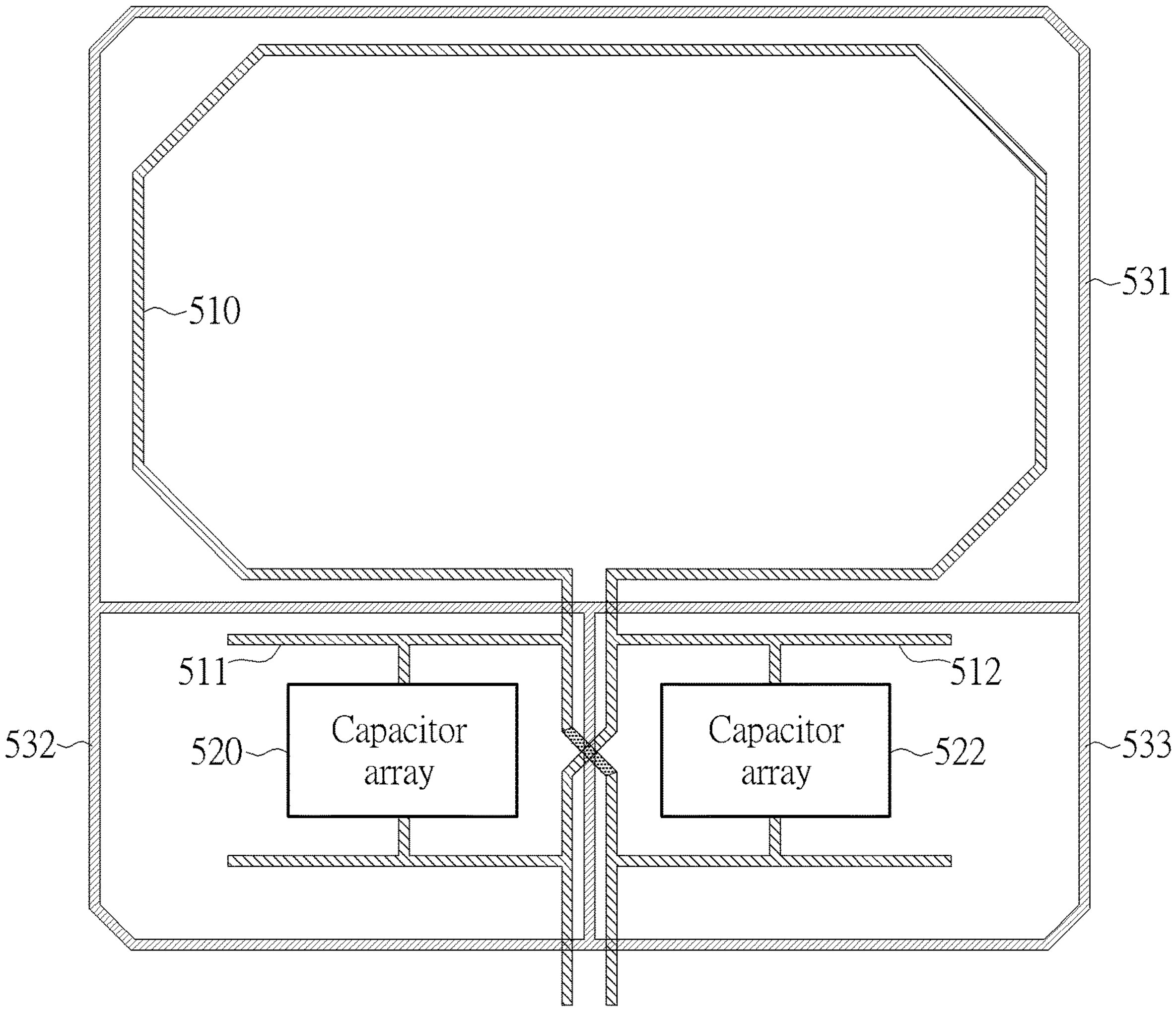
FIG. 5 shows an exemplary layout of a shielding circuit according to still another embodiment of the invention.

FIG. 5 shows an exemplary layout of a shielding circuit according to still another embodiment of the invention. The inductor 510 may comprise at least one coil, and is coupled to the capacitor arrays 520 and 522 through the extra fork 511 and extra fork 512, which may also be regarded as bifurcated wires or branching traces, connected to the coil. The shielding circuit may comprise a first shielding structure 531, a second shielding structure 532 and a second shielding structure 533. The first shielding circuit 531 is disposed adjacent to the inductor 510, for example, surrounding the inductor 510 or have an arrangement similar to surrounding the inductor 510. The second shielding circuit 532 is disposed adjacent to capacitor array 520, for example, surrounding the capacitor array 520 or have an arrangement similar to surrounding the capacitor array 520. The third shielding circuit 533 is disposed adjacent to capacitor array 522, for example, surrounding the capacitor array 522 or have an arrangement similar to surrounding the capacitor array 522.

FIG. 5 shows a circuit structure similar to the one in FIG. 4, and the difference is that the shielding structure configured for the electronic components coupled to the inductor is further divided into two portions, each portion corresponds to a capacitor array, and each forms a closed loop.

Since similar symbols are utilized in FIG. 3, FIG. 4 and FIG. 5 to refer to the same electronic components, detailed descriptions regarding the components shown in FIG. 5 may refer to the descriptions of the corresponding components in FIG. 3 and FIG. 4, and will not be repeated here for brevity.

It is to be noted that although the above embodiments are exemplified by the same type of inductor coil, the proposed shielding circuit is not limited to be applicable only to this type of inductor. In the embodiments of the invention, the inductors that the proposed shielding circuit is able to be applied to may comprise a variety of different type of inductors, such as symmetrical, twin, 8-shaped, or any other types of inductors. In the embodiment of an 8-shaped type inductor, since the 8-shaped type inductor comprises two coils, the shielding structure configured for the inductor may be further divided into two portions, each portion corresponds to an inductive loop, and each forms a closed loop.

In addition, the shielding structures, inductors, extra forks, electronic components, etc. in the above embodiments may be implemented on different layers according to the different requirements of circuit designs, and thus, there may be a plurality of variance in the invention For example, in some embodiments, the inductor (main portion of the inductor) and the first shielding structure may be implemented on the first layer of the semiconductor device, the electronic components may be implemented on the second layer of the semiconductor device, and the second shielding structure may be implemented on the third layer of the semiconductor device, and the extra forks may jump from the first layer to the fourth layer and then back to the first layer. Or, each line segment forming the inductor and extra forks may not have to be implemented on the same layer. Regardless of how to implement the above-mentioned components, the projection results of the layout of the components on a predetermined plane along the vertical direction of the semiconductor device may still have a pattern like the embodiments shown in FIG. 2-FIG. 5.

In the conventional designs, the shielding circuit usually does not consider other electronic components coupled to the inductor. However, since radiation will still be generated by other electronic components and even the traces connected to the inductor, the radiation will eventually cause interference. In the embodiment of the invention, at least two shielding structures with closed loops are respectively utilized to surround the inductor and the extra forks (or, bifurcated wires or branching traces) connected to the inductor, and the two shielding structures with closed loops respectively and effectively reduce the amount of radiation generated by the inductor and other electronic components, as well as the extra forks, thereby reducing or eliminating the overall radiation and effectively solving the radiation problem caused by inductors or other electronic components.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A shielding circuit, applied to a semiconductor device, comprising:

a first shielding structure, forming a first closed loop and disposed adjacent to an inductor comprised in the semiconductor device; and a second shielding structure, forming a second closed loop and disposed adjacent to an electronic component coupled the inductor;

wherein a projected area of the first closed loop on a predetermined plane is smaller than or equal to a projected area of the inductor on the predetermined plane.

2. The shielding circuit of claim 1, wherein the first shielding structure surrounds the inductor.

3. The shielding circuit of claim 1, wherein along a vertical direction, a projection of the first shielding structure on a predetermined plane surrounds a projection of the inductor on the predetermined plane.

4. The shielding circuit of claim 1, wherein the first shielding structure is electrically connected to the second shielding structure.

5. The shielding circuit of claim 1, wherein the second shielding structure surrounds the electronic component.

6. The shielding circuit of claim 1, wherein along a vertical direction, a projection of the second shielding structure on a predetermined plane surrounds a projection of the electronic component on the predetermined plane.

7. A semiconductor device, comprising:

a shielding circuit comprising at least two shielding structures, each shielding structure forming a closed loop; and an electronic component coupled an inductor, wherein one of said at least two shielding structures is disposed adjacent to the electronic component;

wherein the shielding circuit comprises:

a first shielding structure forming a first closed loop and disposed adjacent to the inductor; and a second shielding structure forming a second closed loop and a projection of the second shielding structure on a predetermined plane along a vertical direction surrounds a projection of the electronic component on the predetermined plane;

wherein a projected area of the first closed loop on the predetermined plane is smaller than or equal to a projected area of the inductor on the predetermined plane.

8. The semiconductor device of claim 7, wherein the first shielding structure surrounds the inductor.

9. The semiconductor device of claim 7, wherein a projection of the first shielding structure on the predetermined plane surrounds a projection of the inductor on the predetermined plane.

10. The semiconductor device of claim 7, wherein the first shielding structure is electrically connected to the second shielding structure.

11. The semiconductor device of claim 7, wherein the second shielding structure surrounds the electronic component.

* * * * *